United States Patent
Keller et al.

(10) Patent No.: US 11,588,347 B2
(45) Date of Patent: Feb. 21, 2023

(54) SINGLE PHASE FAULT ISOLATION AND RESTORATION WITH LOAD ESTIMATION

(71) Applicant: G & W ELECTRIC COMPANY, Bolingbrook, IL (US)

(72) Inventors: Erich Keller, Naperville, IL (US); Nicholas Carmine DiFonzo, Des Plaines, IL (US)

(73) Assignee: G & W Electric Company, Bolingbrook, IL (US)

( * ) Notice: Subject to any disclaimer, the term of this patent is extended or adjusted under 35 U.S.C. 154(b) by 110 days.

(21) Appl. No.: 16/933,652

(22) Filed: Jul. 20, 2020

(65) Prior Publication Data

US 2022/0021236 A1 Jan. 20, 2022

(51) Int. Cl.
*H02J 13/00* (2006.01)
*G01R 31/08* (2020.01)
*G05B 9/02* (2006.01)

(52) U.S. Cl.
CPC ........ *H02J 13/0004* (2020.01); *G01R 31/086* (2013.01); *G05B 9/02* (2013.01); *H02J 13/00002* (2020.01)

(58) Field of Classification Search
CPC .......... H02J 3/00; H02J 3/003; H02J 2203/20; H02J 3/38; H02J 3/008; H02J 13/0004;
(Continued)

(56) References Cited

U.S. PATENT DOCUMENTS 7,154,722 B1 12/2006 Stoupis et al.
7,751,166 B2 * 7/2010 Stoupis ............... H02J 13/0062
361/64
(Continued)

FOREIGN PATENT DOCUMENTS

CN 104362579 A 2/2015
CN 107947134 A 4/2018
(Continued)

OTHER PUBLICATIONS

Liao et al, "Circulating-Current Indices for Three-Phase Boost Rectifiers with Different Ratings", 2007, pp. 1438-1442 downloaded from https://ieeexplore.ieee.org/stamp/stamp.jsp?tp=&arnumber=4460005&tag=1 (Year: 2007).*

(Continued)

*Primary Examiner* — Rocio Del Mar Perez-Velez
*Assistant Examiner* — Olvin Lopez Alvarez
(74) *Attorney, Agent, or Firm* — Michael Best & Friedrich LLP

(57) ABSTRACT

A processor receives an indication of a fault from a first isolation device. The processor sends a first open command to a downstream isolation device downstream of the fault, identifies a tie-in isolation device, and identifies a line section without current monitoring positioned between the tie-in isolation device and the downstream isolation device. The line section has a plurality of line segments, each having a load rating. The processor receives incoming and exiting current measurements for the line section and estimates a first current load for each of the line segments in the line section based on the incoming and exiting current measurements and the load ratings. The processor selects an intermediate isolation device between the tie-in isolation device and the downstream isolation device based on the first current loads, sends a second open command to the intermediate isolation device, and sends a close command to the tie-in isolation device.

20 Claims, 15 Drawing Sheets

(58) Field of Classification Search
CPC ... H02J 13/00002; G05B 13/048; G05B 9/02; Y02E 60/00; Y04S 40/20; Y04S 50/10; Y04S 10/50; G01R 31/086; H02H 3/13; H02H 7/261

See application file for complete search history.

(56) References Cited

U.S. PATENT DOCUMENTS

| | | | | |
|---|---|---|---|---|
| 8,121,740 | B2* | 2/2012 | Yang | H02J 13/00034 700/297 |
| 10,680,430 | B2* | 6/2020 | Chaiquin | H02J 13/00034 |
| 11,022,640 | B2* | 6/2021 | Keller | G01R 31/086 |
| 2005/0251296 | A1* | 11/2005 | Tracy Nelson | H02H 3/063 700/286 |
| 2006/0109600 | A1 | 5/2006 | Warren | |
| 2008/0211511 | A1* | 9/2008 | Choi | H02H 3/081 324/522 |
| 2009/0112375 | A1* | 4/2009 | Popescu | H02H 1/0092 700/286 |
| 2010/0036538 | A1 | 2/2010 | Stergiou et al. | |
| 2011/0029148 | A1* | 2/2011 | Yang | G05F 1/66 700/297 |
| 2012/0155557 | A1 | 6/2012 | Bush et al. | |
| 2012/0203479 | A1 | 8/2012 | Yadav et al. | |
| 2013/0054042 | A1* | 2/2013 | du Toit | H02H 7/26 700/292 |
| 2013/0063273 | A1 | 3/2013 | Bhageria et al. | |
| 2013/0070378 | A1 | 3/2013 | Witte | |
| 2013/0325402 | A1 | 12/2013 | Vukojevic et al. | |
| 2014/0028116 | A1 | 1/2014 | O'Brien et al. | |
| 2017/0358914 | A1* | 12/2017 | Chaiquin | H02J 13/00036 |
| 2018/0233895 | A1 | 8/2018 | O'Regan et al. | |
| 2019/0245342 | A1 | 8/2019 | Sharon | |
| 2019/0280476 | A1 | 9/2019 | Fan et al. | |
| 2020/0072894 | A1 | 3/2020 | Montenegro et al. | |
| 2020/0119546 | A1 | 4/2020 | Quinlan | |
| 2020/0191841 | A1 | 6/2020 | Lakirovich et al. | |
| 2020/0195007 | A1 | 6/2020 | Sun et al. | |
| 2020/0309841 | A1 | 10/2020 | Sharon | |
| 2021/0091557 | A1* | 3/2021 | Meisinger | H02H 7/26 |

FOREIGN PATENT DOCUMENTS

| | | |
|---|---|---|
| CN | 109494696 A | 3/2019 |
| CN | 108376974 B | 9/2019 |

OTHER PUBLICATIONS

Canadian Patent Office Examination Report for Application No. 3,094,663 dated Oct. 28, 2021 (3 pages).

European Patent Office Extended Search Report for Application No. 21181398.5 dated Dec. 13, 2021 (9 pages).

European Patent Office Extended Search Report for Application No. 21181375.3 dated Dec. 13, 2021 (10 pages).

Greer et al., "Distribution automation systems with advanced features," 2011 Rural Electric Power Conference, 2011, pp. C4-1-C4-15.

G&W Electric Company, Lazer Automation: Catalog, Mar. 2012 (8 Pages).

G&W Electric Company, Lazer Automation: Lazer I Automation Solutions brochure, Apr. 2012 (4 Pages).

G&W Electric Company, Lazer Automation: Fault Detection, Isolation, Reconfiguration and Loss of Voltage Proposal brochure, Midwest Energy Michigan, Aug. 15, 2013 (37 Pages).

G&W Electric Company, Lazer Automation: Loop Automation Schemes brochure, available at least as early as Jan. 21, 2015 (3 Pages).

G&W Electric Company, Lazer II Restoration Automation brochure, available at least as early as Jan. 21, 2015 (1 Page).

United States Patent Office Action for U.S. Appl. No. 17/071,852 dated Nov. 10, 2020 (13 pages).

United States Patent Office Action for U.S. Appl. No. 17/071,853 dated Dec. 4, 2020 (6 pages).

European Patent Office Extended Search Report for Application No. 20200402.4 dated Feb. 26, 2021 (7 pages).

Le et al., "FLISR Approach for Smart Distribution Networks Using E-Terra Software - A Case Study," Energies, Nov. 2018, 11(12):3333. pages 33.

Canadian Patent Office Second Office Action for Application No. 3,094,663 dated Aug. 23, 2022 (3 pages).

* cited by examiner

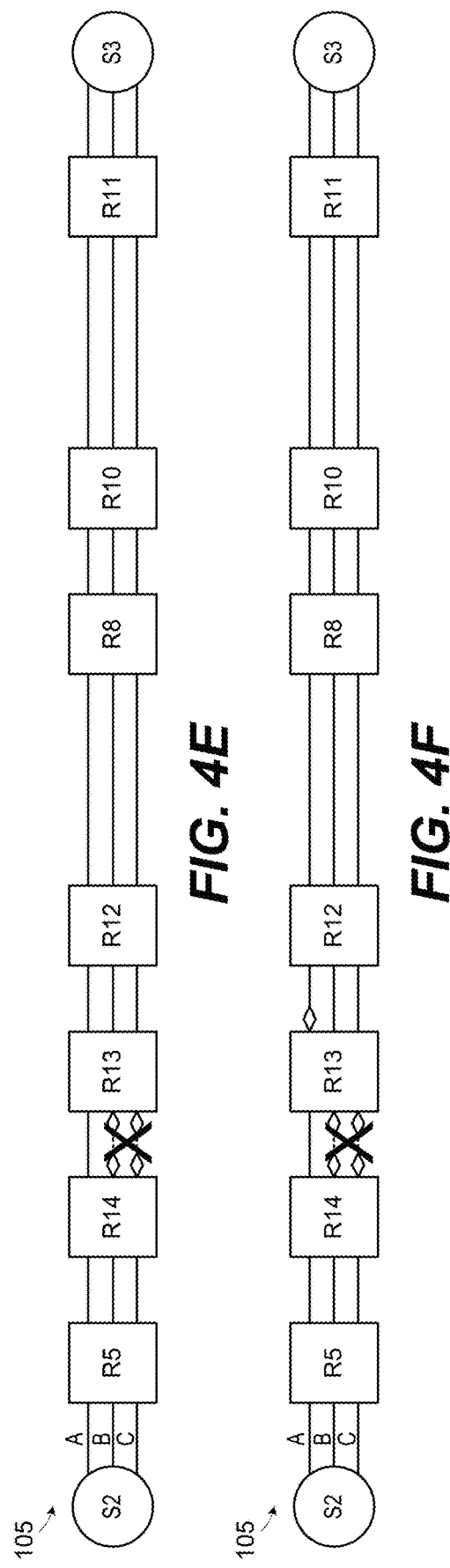

SINGLE PHASE FAULT ISOLATION AND RESTORATION WITH LOAD ESTIMATION

FIELD OF DISCLOSURE

Embodiments described herein relate to electric power distribution networks. More particularly, embodiments described herein relate to systems and methods for providing single phase fault isolation and restoration with load estimation avoidance in an electric power distribution network.

SUMMARY

Electric power distribution networks (sometimes referred to as "power distribution networks" or "distribution networks") include fault monitoring equipment that identifies problems in the system and opens isolation devices to isolate the problems. Example problems with the distribution system include overcurrent faults, phase-to-phase faults, ground faults, etc. Faults may arise from various causes, for example, equipment failure, weather-related damage to equipment, and others. Switching equipment is provided in the power distribution network to isolate the detected faults. In some instances, a fault may be detected by an isolation device that is not located closest to the fault. As a result, power may be interrupted for more customers than necessary. Various isolation devices attempt to reclose to restore power to non-affected portions of the power distribution network. Power distribution networks typically use three-phase transmission lines, and the isolation devices are controlled to isolate all three phases in response to a detected fault. Even in cases where a particular fault only involves one or two of the phases, power is interrupted for all customers on the affected transmission line.

Embodiments described herein provide, among other things, systems and methods for providing single phase fault isolation and restoration with load estimation in a power distribution network.

One embodiment includes a system for controlling a power distribution network that provides power using a plurality of phases includes an electronic processor. The electronic processor is configured to receive a fault indication associated with a fault in the power distribution network from a first isolation device of a plurality of isolation devices. The electronic processor sends a first open command to a downstream isolation device downstream of the fault, identifies a tie-in isolation device, and identifies a first line section without current monitoring positioned between the tie-in isolation device and the downstream isolation device. The first line section has a plurality of line segments, and each line segment has a load rating. The electronic processor receives an incoming current measurement and an exiting current measurement for the first line section and estimates a first current load for each of the line segments in the first line section based on the incoming current measurement, the exiting current measurement, and the load ratings of the line segments. The electronic processor selects an intermediate isolation device between the tie-in isolation device and the downstream isolation device based on the first current loads, sends a second open command to the intermediate isolation device, and sends a close command to the tie-in isolation device.

Another embodiment includes a method for controlling a power distribution network. The method includes receiving, by an electronic processor, a fault indication associated with a fault in the power distribution network from a first isolation device of a plurality of isolation devices, sending, by the electronic processor, a first open command to a downstream isolation device downstream of the fault, identifying, by the electronic processor, a tie-in isolation device, and identifying, by the electronic processor, a first line section without current monitoring positioned between the tie-in isolation device and the downstream isolation device. The first line section has a plurality of line segments, and each line segment has a load rating. The method further comprises receiving, by the electronic processor, an incoming current measurement and an exiting current measurement for the first line section, estimating, by the electronic processor, a first current load for each of the line segments in the first line section based on the incoming current measurement, the exiting current measurement, and the load ratings of the line segments, selecting, by the electronic processor, an intermediate isolation device between the tie-in isolation device and the downstream isolation device based on the first current loads, sending, by the electronic processor, a second open command to the intermediate isolation device, and sending, by the electronic processor, a close command to the tie-in isolation device.

Other aspects of the disclosure will become apparent by consideration of the detailed description and accompanying drawings.

BRIEF DESCRIPTION OF THE DRAWINGS

FIGS. 4A-4F are diagrams illustrating operation of the system of FIG. 1 to handle a fault, according to some embodiments.

DETAILED DESCRIPTION

One or more embodiments are described and illustrated in the following description and accompanying drawings. These embodiments are not limited to the specific details provided herein and may be modified in various ways. Furthermore, other embodiments may exist that are not described herein. Also, the functionality described herein as being performed by one component may be performed by multiple components in a distributed manner. Likewise, functionality performed by multiple components may be consolidated and performed by a single component. Similarly, a component described as performing particular functionality may also perform additional functionality not described herein. For example, a device or structure that is "configured" in a certain way is configured in at least that way, but may also be configured in ways that are not listed. Furthermore, some embodiments described herein may include one or more electronic processors configured to perform the described functionality by executing instructions stored in non-transitory, computer-readable medium. Similarly, embodiments described herein may be implemented as non-transitory, computer-readable medium storing instructions executable by one or more electronic processors to perform the described functionality. As used herein, "non-transitory computer-readable medium" comprises all computer-readable media but does not consist of a transitory, propagating signal. Accordingly, non-transitory computer-readable medium may include, for example, a hard disk, a CD-ROM, an optical storage device, a magnetic storage device, a ROM (Read Only Memory), a RAM (Random Access Memory), register memory, a processor cache, or any combination thereof.

Also, the phraseology and terminology used herein is for the purpose of description and should not be regarded as limiting. For example, the use of "including," "containing," "comprising," "having," and variations thereof herein is meant to encompass the items listed thereafter and equivalents thereof as well as additional items. The terms "connected" and "coupled" are used broadly and encompass both direct and indirect connecting and coupling. Further, "connected" and "coupled" are not restricted to physical or mechanical connections or couplings and can include electrical connections or couplings, whether direct or indirect. In addition, electronic communications and notifications may be performed using wired connections, wireless connections, or a combination thereof and may be transmitted directly or through one or more intermediary devices over various types of networks, communication channels, and connections. Moreover, relational terms such as first and second, top and bottom, and the like may be used herein solely to distinguish one entity or action from another entity or action without necessarily requiring or implying any actual such relationship or order between such entities or actions.

Figure 1:
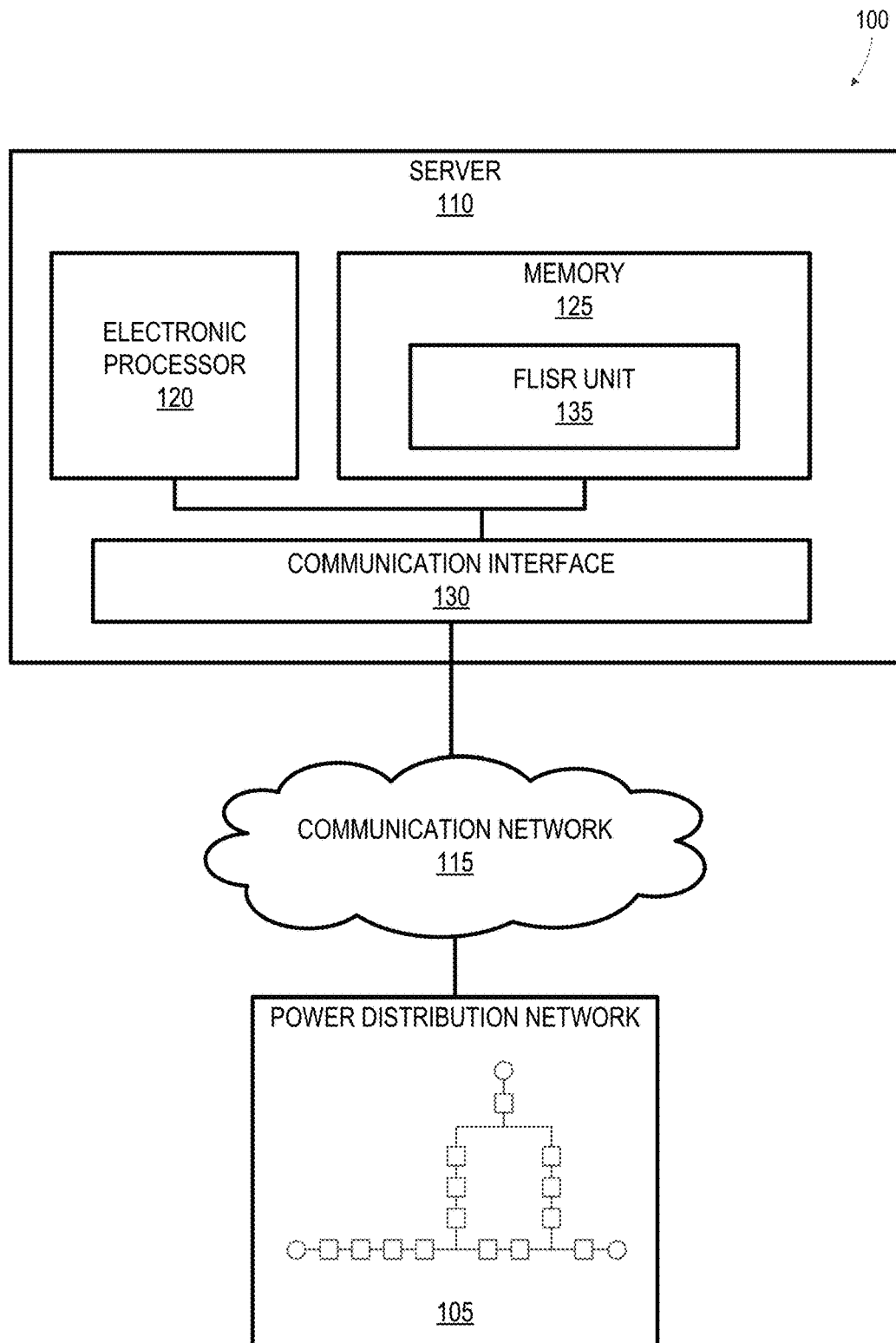
FIG. 1 is a simplified block diagram of a system for controlling single phase fault isolation in a power distribution network, according to some embodiments.

FIG. 1 illustrates a system 100 for controlling a power distribution network 105, according to some embodiments. In the example shown, the system 100 includes a server 110 communicating with entities in the power distribution network 105 over one or more communication networks 115. In some embodiments, the system 100 includes fewer, additional, or different components than illustrated in FIG. 1. For example, the system 100 may include multiple servers 110. The communication network 115 employs one or more wired or wireless communication sub-networks or links. Portions of the communication network 115 may be implemented using a wide area network, such as the Internet, a local area network, such as an Ethernet network, a Wi-Fi™ network, a Bluetooth™ network or and combinations or derivatives thereof. In some embodiments, components of the system 100 communicate through one or more intermediary devices not illustrated in FIG. 1.

The server 110 is a computing device that may serve as a centralized resource for controlling entities in the power distribution network 105. As illustrated in FIG. 1, the server 110 includes an electronic processor 120, a memory 125, and a communication interface 130. The electronic processor 120, the memory 125 and the communication interface 130 communicate wirelessly, over one or more communication lines or buses, or a combination thereof. The server 110 may include additional components than those illustrated in FIG. 1 in various configurations. The server 110 may also perform additional functionality other than the functionality described herein. Also, the functionality described herein as being performed by the server 110 may be distributed among multiple devices, such as multiple servers included in a cloud service environment.

The electronic processor 120 includes a microprocessor, an application-specific integrated circuit (ASIC), or another suitable electronic device for processing data. The memory 125 includes a non-transitory computer-readable medium, such as read-only memory (ROM), random access memory (RAM) (for example, dynamic RAM (DRAM), synchronous DRAM (SDRAM), and the like), electrically erasable programmable read-only memory (EEPROM), flash memory, a hard disk, a secure digital (SD) card, another suitable memory device, or a combination thereof. The electronic processor 120 is configured to access and execute computer-readable instructions ("software") stored in the memory 125. The software may include firmware, one or more applications, program data, filters, rules, one or more program modules, and other executable instructions. For example, the software may include instructions and associated data for performing a set of functions, including the methods described herein. For example, as illustrated in FIG. 1, the memory 125 may store instructions for executing a fault location, isolation, and restoration (FLISR) unit 135 to control entities in the power distribution network 105.

The communication interface 130 allows the server 110 to communicate with devices external to the server 110. For example, as illustrated in FIG. 1, the server 110 may communicate with entities in the power distribution network 105. The communication interface 130 may include a port for receiving a wired connection to an external device (for example, a universal serial bus (USB) cable and the like), a transceiver for establishing a wireless connection to an external device (for example, over one or more communication networks 115, such as the Internet, local area network (LAN), a wide area network (WAN), and the like), or a combination thereof.

Figure 2:
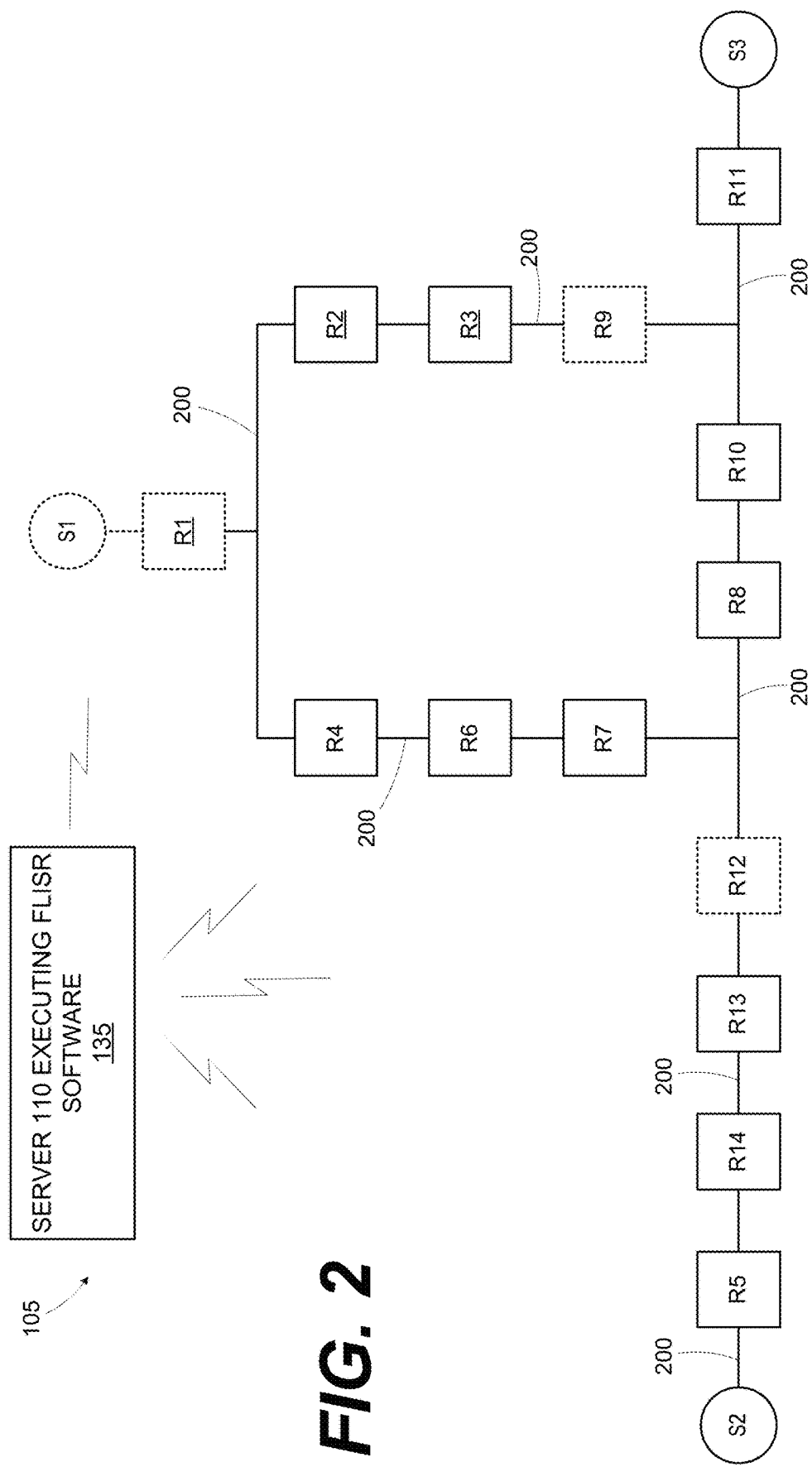
FIG. 2 is a simplified diagram of a power distribution network, according to some embodiments.

FIG. 2 is a simplified diagram of the power distribution network 105, according to some embodiments. In the example shown, the power distribution network 105 comprises sources, S1-S3, and isolation devices R1-R14. The sources S1-S3 and isolation devices R1-R14 are connected by transmission lines 200. In general, the isolation devices R1-R14 serve to segment the power distribution network 105 so that power is provided via a single source S1-S3 and to isolate portions of the power distribution network 105 in response to identified faults. The isolation devices R1-R14 may also be referred to as reclosers. Open transmission lines 200 are illustrated with dashed lines. An open diamond is used in the figures and placed adjacent an isolation device 305 (as noted, also illustrated in some cases as R1-R14) isolating the transmission line 200 from a power source. In general, only one source S1-S3 feeds a section of the power distribution network 105. Certain isolation devices R1-R14 are designated as tie-in isolation devices that allow a different source S1-S3 to be tied into a section normally fed by a different source S1-S3. For example, the source S2 feeds the transmission lines 200 associated with the isolation devices R5, R14, R13, R12. The isolation device R12 is in an open state and is a tie-in isolation device that may be closed to provide power from one of the other sources S1, S3. Similarly, isolation devices R7, R9 are tie-in isolation devices associated with the source S1. FIG. 2 illustrates the normal operating configuration of the power distribution network 105 with no faults.

Figure 3:
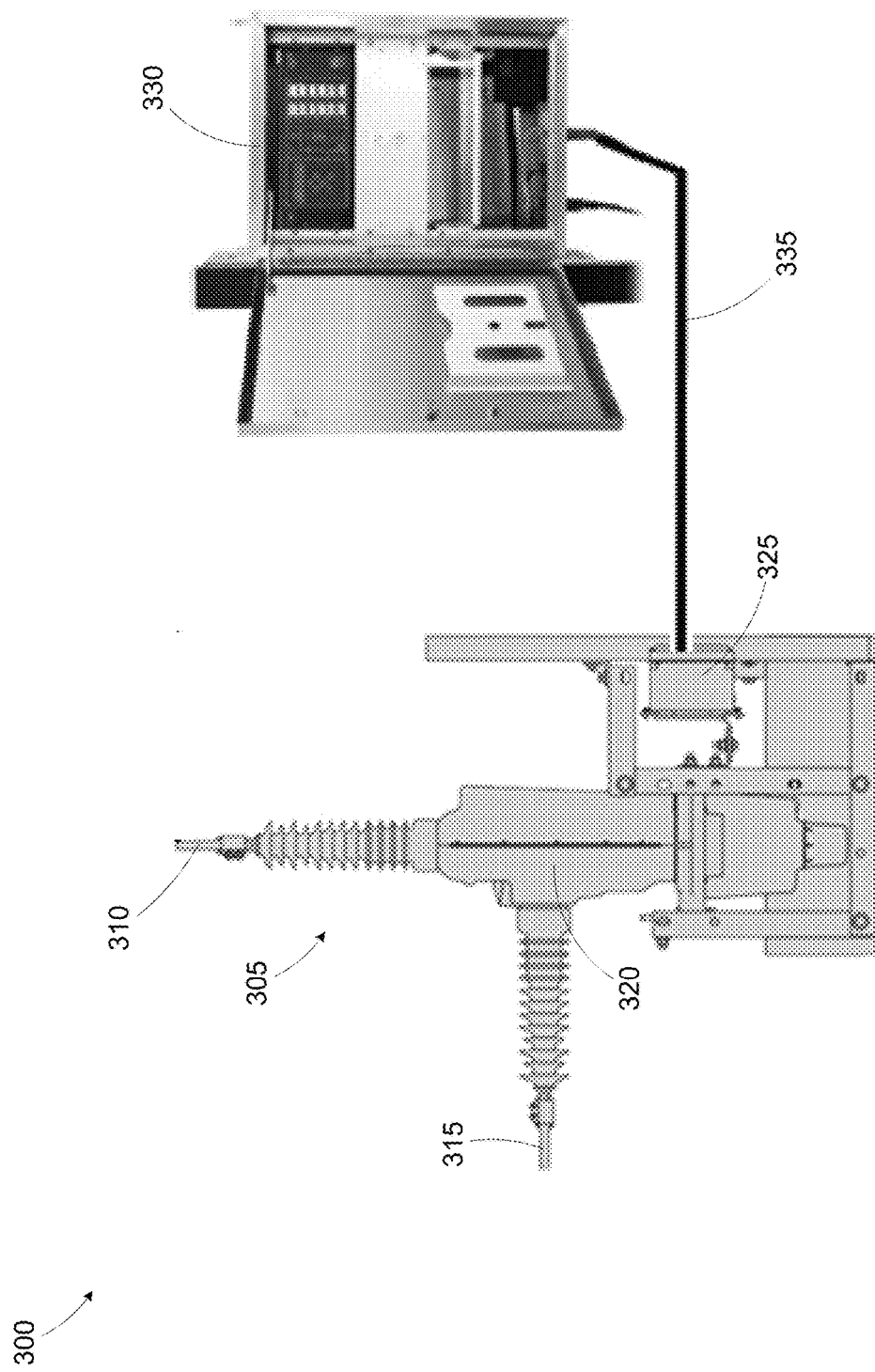
FIG. 3 is a diagram of a switchgear system including an isolation device, according to some embodiments.

FIG. 3 is a diagram of a switchgear system 300 including an isolation device 305, according to some embodiments. As noted, the isolation device 305 may also be referred to as a recloser. Each of the isolation devices R1-R14 in FIG. 2 may be configured in a manner that is the same as or similar to the configuration of the isolation device 305. In the example provided in FIG. 3, the isolation device 305 receives high voltage electrical power via a line connection 310 and delivers the high voltage electrical power via a load connection 315. An interrupting mechanism 320 (for example, a vacuum interrupter) is electrically coupled between the line connection 310 and the load connection 315 to selectively interrupt current flow therebetween. The switchgear system 300 also includes a junction board 325 that is electrically coupled to the isolation device 305. A controller 330 is electrically coupled to the junction board 325 via a control cable 335. In FIG. 3, only one phase of the isolation device 305 is illustrated. For ease of description, the other two phases of the three-phase isolation device 305 are not shown or described in detail. However, the other two phases of the three-phase isolation device 305 may include similar components as shown in FIG. 3. For example, each of the other two phases may include an interrupting medium, line and load connections, and a junction board. The controller 330 may be connected to control all the junction boards 325.

The isolation device 305 automatically tests the electrical line to identify a fault condition, and automatically opens the line if a fault is detected. In some embodiments, the isolation device 305 opens all three phases in response to detecting a fault, for example, an overcurrent fault. The isolation device 305 may operate in a recloser mode or a one-shot mode.

In the recloser mode, the isolation device 305 determines whether the fault condition was only temporary and has resolved and automatically resets to close the line and restore electric power. Many trouble conditions on high voltage lines are temporary (for example, lightning, windblown tree branches, windblown transmission lines, animals, etc.), and will, by their nature, remove themselves from the transmission line if the power is shut off before permanent damage occurs. The isolation device 305 senses when trouble occurs and automatically opens to remove power. After a short delay, which may be recognized as or materialize as a lightbulb flicker, for example, the isolation device 305 recloses to restore power. However, if the trouble condition is still present, the isolation device 305 opens again. If the trouble condition persists for a predetermined number of times (for example, three), the isolation device 305 locks open and sends a fault notification via the controller 330 to a centralized controller, for example, the server 110 of FIG. 1 executing the FLISR unit 135. Examples of long-lasting or permanent problem conditions include damaged or down transmission lines, and physical equipment failure or damage.

In the one-shot mode, the automatic recloser functionality of the isolation device 305 is disabled. If a fault condition is identified, the isolation device 305 locks open and sends a fault indication via the controller 330 without attempting to reclose.

Figure 4A:
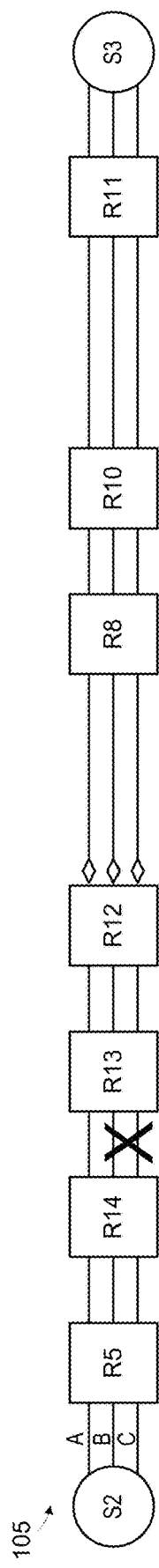
Figure 4B:
Figure 4C:
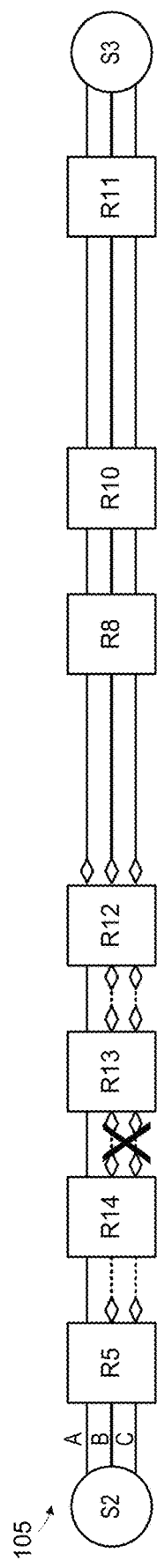
Figure 4D:
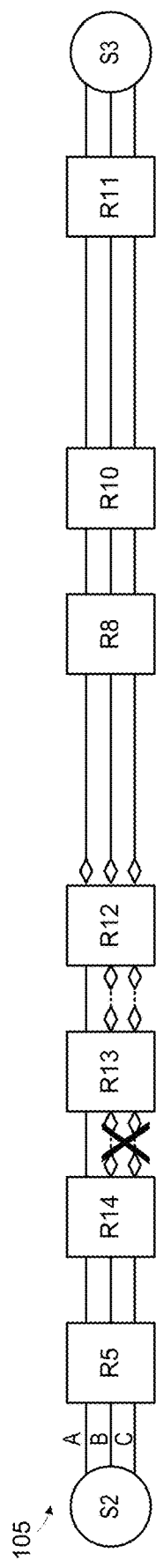
Figure 5:
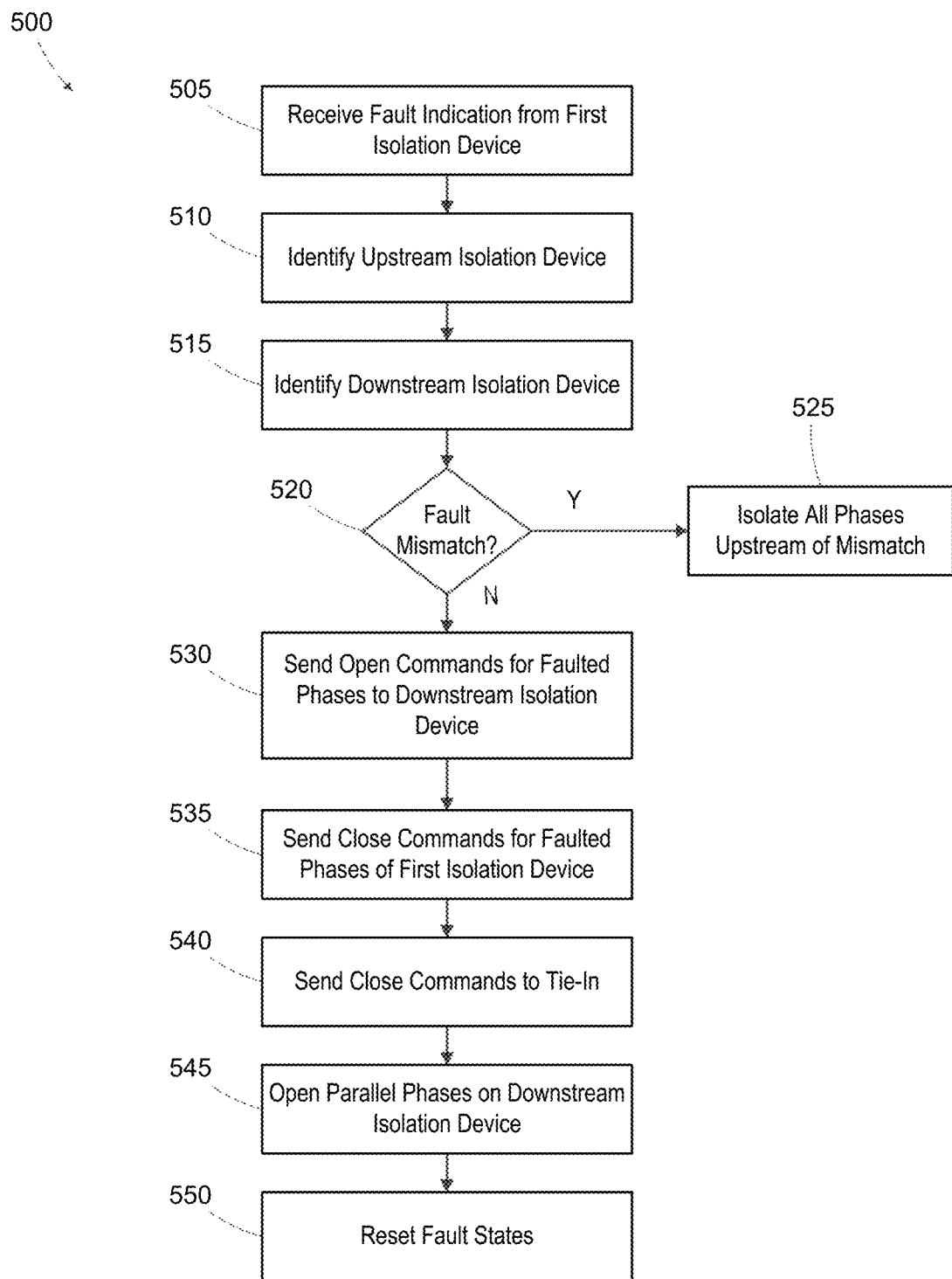
FIG. 5 is a flowchart of a method for operating the system of FIG. 1 to handle a fault, according to some embodiments.

Referring to FIGS. 4A-4F and FIG. 5, the operation of the system of FIG. 1 is illustrated to handle a fault. FIGS. 4A-4F are diagrams illustrating the operation of the system of FIG. 1 to handle a fault in a portion of the power distribution network 105 of FIG. 2, according to some embodiments. FIG. 5 is a flowchart of a method 500 for operating the system of FIG. 1 to handle a fault, according to some embodiments.

In some embodiments, a lockout fault is a fault condition that causes the isolation device 305 identifying the condition to lock in an open state. Example lockout fault conditions include voltage faults, phase to phase faults, ground faults, etc. In some embodiments, the isolation device 305 signals a fault indication to the FLISR unit 135 of FIG. 1 after attempting to reclose a predetermined number of times, as described above.

In some instances, the isolation device 305 that opens or trips is not the isolation device 305 closest to the fault. For example, the communication links between the isolation devices 305 and the FLISR unit 135 may have different latencies. For purposes of the following example, assume that a phase to phase fault is present between the R14 isolation device 305 and the R13 isolation device 305. FIG. 4A illustrates the power distribution network 105 prior to any automatic operations, with the fault illustrated between the R14 and R13 isolation devices 305.

In response to the fault, the R5 isolation device 305 locks open and sends a fault indication (in this example, as indicated by the "!" (exclamation mark) in the R5 block). Referring to FIG. 5, a fault indication is received in the FLISR unit 135 (block 505), for example, from the R5 isolation device 305. In some embodiments, the FLISR unit 135 waits for a predetermined time interval (for example, 30 seconds) after receiving the fault indication before proceeding with restoration operations. As shown in FIG. 4B, the R5 isolation device 305 is locked open for a first subset of the phases that includes the faulted phases, B and C. A second subset of the phases includes the non-faulted phase, A.

After receiving fault indication (block 505), the FLISR unit 135 attempts to identify the fault location by examining the fault states of other isolation devices downstream of the fault issuing R5 isolation device 305. Isolation devices 305 with asserted faults states are identified with "!" indicators, and isolation devices 305 with clear fault states are identified with "-" indicators (dashes) in FIG. 4B. In some embodiments, the isolation devices 305 send fault states at periodic time intervals, immediately in response to certain events, or in response to a refresh query from the FLISR unit 135.

As shown in block 510, the FLISR unit 135 identifies an upstream isolation device 305 representing the isolation device 305 immediately upstream of the fault, and as shown in block 515, the FLISR unit 135 identifies a downstream isolation device 305 representing the isolation device 305 immediately downstream of the fault. In the example of FIG. 4B, the R14 isolation device 305 is the upstream isolation device 305, and the R13 isolation device 305 is the downstream isolation device 305. In general, the isolation devices 305 downstream of the R5 isolation device 305, but positioned before or upstream of the fault, should have the same fault state as the R5 isolation device 305. The isolation device 305 immediately downstream of the fault should have a fault state that is clear since the fault does not affect the transmission lines associated with that isolation device 305. In some embodiments, the isolation device 305 that locks out and generates the fault indication is also the upstream isolation device 305. The FLISR unit 135 identifies the isolation device 305 furthest downstream in a string of isolation devices 305 having a fault state that matches the fault state of the triggering R5 isolation device 305 as the upstream isolation device (in this example, the R14 isolation device 305) (block 510). The FLISR unit 135 identifies the isolation device 305 downstream of the R14 upstream isolation device 305 having a fault state that does not register the fault seen by the triggering R5 isolation device as the downstream isolation device 305 (in this example, the R13 isolation device 305).

As shown in block 520, the FLISR unit 135 identifies a fault mismatch. A fault mismatch is registered in response to an isolation device 305 downstream of the triggering R5 isolation device 305 having a fault state that registers a different fault condition than the fault state of the triggering isolation device 305. For example, a mismatch may be identified in an example where the triggering isolation device 305 registers a phase to phase fault affecting phases B and C, and one of the downstream isolation devices 305 registers a fault with phase A. Although block 520 is illustrated as being performed after block 515, the mismatch condition is identified concurrently with the identification of the upstream isolation device 305 (block 510) and the identification of the downstream isolation device 305 (block 515). In some embodiments, if a fault mismatch is identified (block 520), the FLISR unit 135 opens all phases of the isolation device 305 prior to the fault mismatch as shown in block 525 and proceeds with three phase restoration. If a fault mismatch is not identified (block 520), the FLISR unit 135 proceeds with single phase restoration operations. Alternatively, in some embodiments, the fault state of the triggering isolation device 305 controls the fault handling, even if one of the isolation devices 305 downstream of the triggering isolation device 305 has a fault mismatch.

As shown in block 530, the FLISR unit 135 sends open commands for the faulted phases in the first subset to the R13 downstream isolation device 305, as illustrated in FIG. 4C. In some embodiments, the FLISR unit 135 also sends open commands to the R14 upstream isolation device 305 prior to opening the R13 downstream isolation device 305. In an instance where the isolation device 305 identifying the fault condition is also the upstream isolation device 305 (in this example, closest to the fault), the isolation device 305 identifying the fault condition is already open for the faulted states, and an open command need not be sent to the upstream isolation device 305.

As shown in block 535, the FLISR unit 135 sends close commands for the faulted phases in the first subset to the R5 isolation device 305 that triggered the fault condition. In an instance where the isolation device 305 identifying the fault condition is also the upstream isolation device 305 (in this example, closest to the fault), close commands need not be sent to the upstream isolation device 305. Closing the non-faulted phases restores power to customers up to the R14 upstream isolation device 305. In some embodiments, when there are multiple non-faulted phases, the FLISR unit 135 closes the non-faulted phases individually using sequential close commands.

As shown in block 540, the FLISR unit 135 sends close commands for a tie-in isolation device 305, as illustrated in FIG. 4E. For example, the R12 isolation device 305 is downstream of the fault and the R13 downstream isolation device 305 and can provide power from the source S3. In some embodiments, the FLISR unit 135 sends a ganged close command to the R12 tie-in isolation device 305. In some embodiments, the FLISR unit 135 sends mode messages to the R5, R14, R13, R12, R8, R10, R11 isolation devices 305 on the parallel phases to the alternate source S3 placing them in one shot mode prior to sending the close commands. Thus, if one of the isolation devices 305 on the parallel phases trips, automatic reclosing is prevented.

As shown in block 545, the FLISR unit 135 sends open commands to the R13 downstream isolation device 305 for the parallel phases (in this example, the phases in the second subset), as illustrated in FIG. 4F. For example, the A phase for the R13 isolation device 305 is fed by both the source S2 and the source S3. Opening the non-faulted phase removes this parallel source condition. In some embodiments, when there are multiple non-faulted phases in the second subset, the FLISR unit 135 opens the non-faulted phases on the R13 downstream isolation device 305 individually using sequential open commands. In some embodiments, after completing the tie-in processing (block 545) without any trips, the FLISR unit 135 sends mode messages to the R15, R14, R13, R12, R8, R10, and R11 isolation devices 305 on the path to both sources S2, S3 placing them back in reclose mode.

As shown in block 550, the FLISR unit 135 sends fault state reset commands to the R5 and R14 isolation devices 305 to reset the fault states and allow fault monitoring to be processed using the re-configured the power distribution network 105.

Figure 6B:
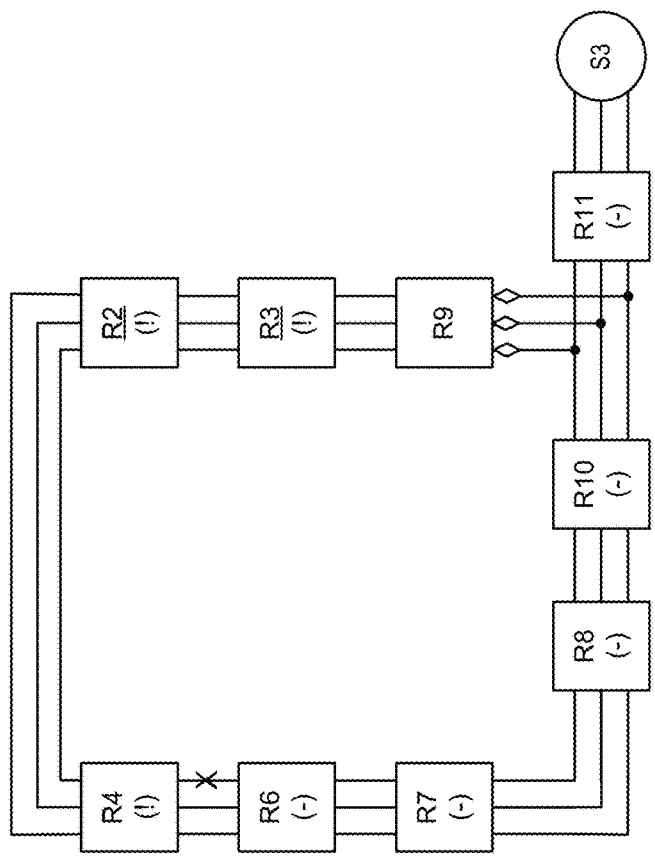
FIGS. 6A-6E are diagrams illustrating operation of the system of FIG. 1 to handle a loss of voltage fault, according to some embodiments.
Figure 6A:
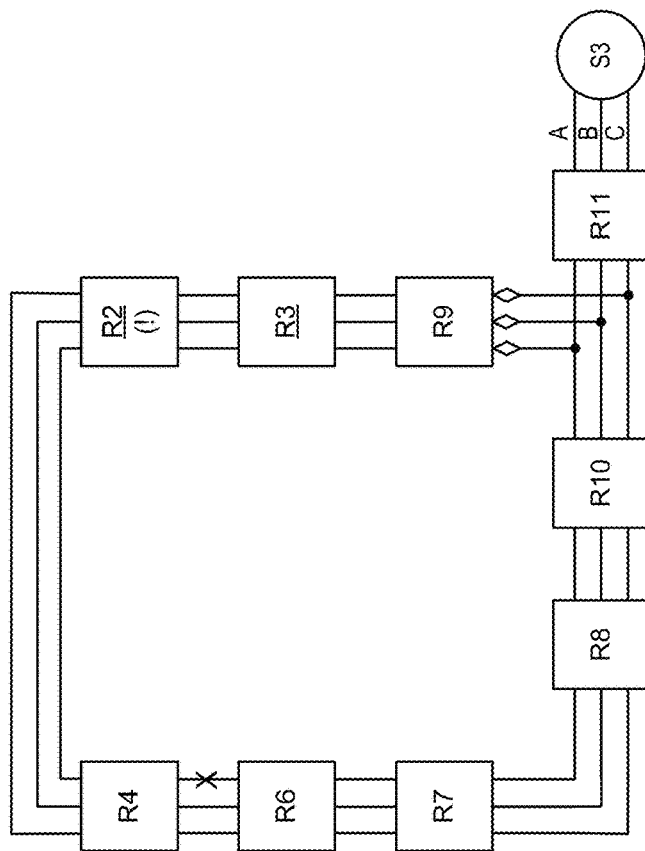
Figure 6D:
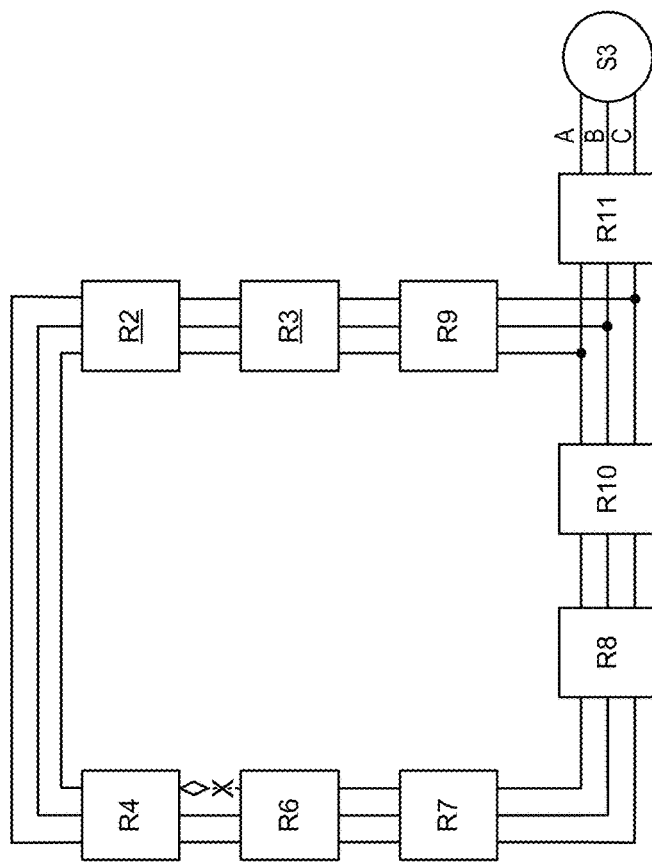
Figure 6C:
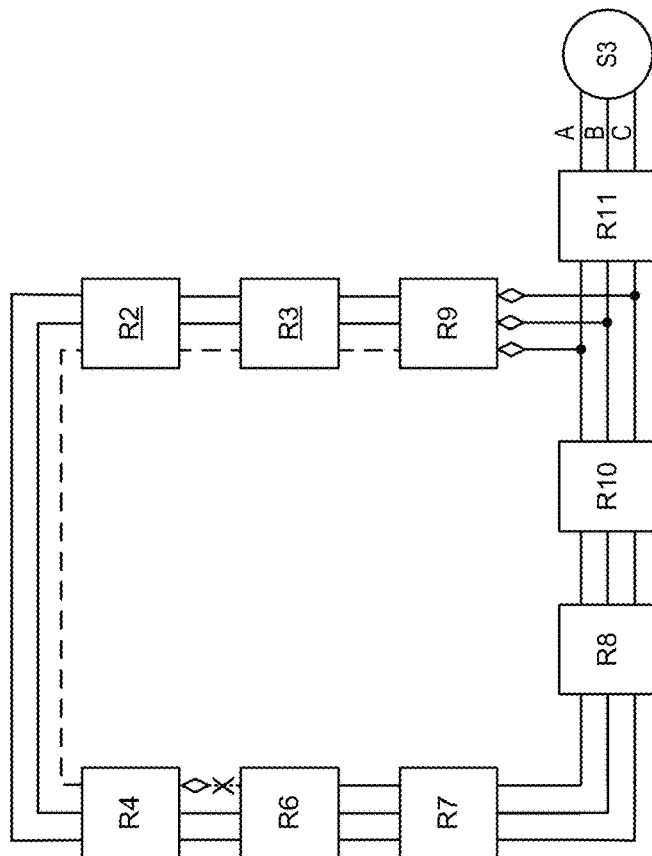
Figure 6E:
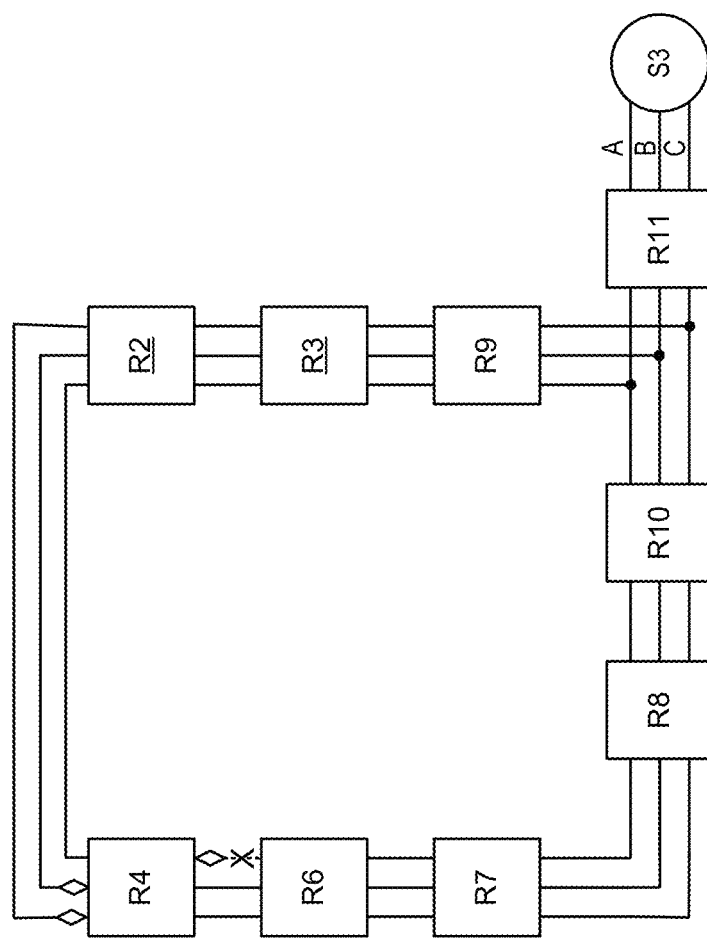
Figure 7:
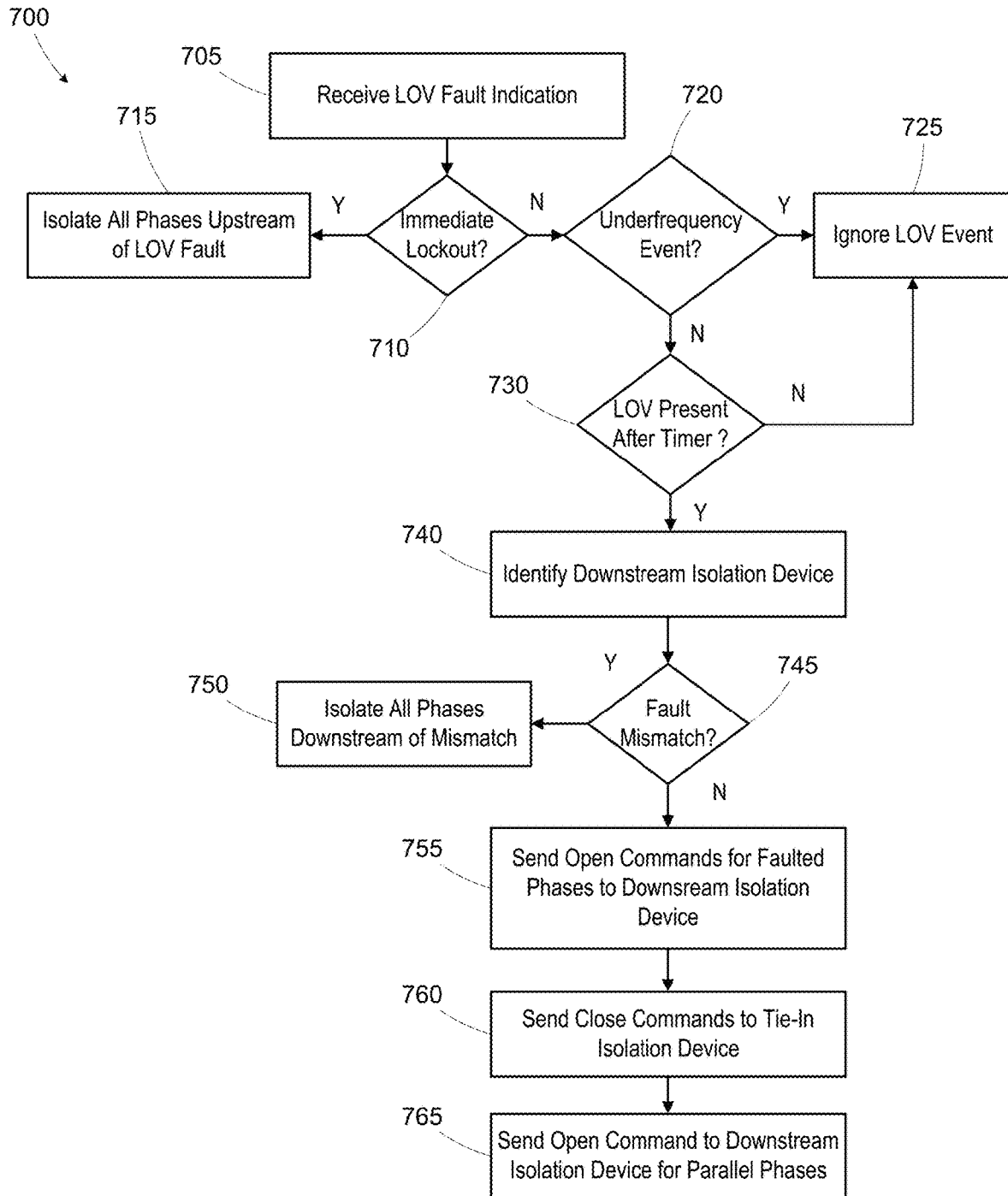
FIG. 7 is a flowchart of a method for operating the system of FIG. 1 to handle a loss of voltage fault, according to some embodiments.

Referring to FIGS. 6A-6E and FIG. 7, the operation of the system of FIG. 1 is illustrated for handling a loss of voltage (LOV) fault. FIGS. 6A-6E are diagrams illustrating the operation of the system of FIG. 1 for handling an LOV fault in a portion of the power distribution network 105 of FIG. 2, according to some embodiments. FIG. 7 is a flowchart of a method 700 for operating the system of FIG. 1 to handle an LOV fault, according to some embodiments.

In some embodiments, an LOV fault is detected by one or more of the isolation devices 305 but does not cause an automatic lockout or trip of the identifying isolation device 305. An LOV fault is defined as an event where the measured voltage on at least one phase drops below a predefined threshold level. In some embodiments, the predefined threshold level (for example, 5-95%) is a user-specified parameter.

Referring to FIG. 7, an LOV fault indication is received as shown in block 705, for example, from the R2 isolation device 305 (in this example, as indicated by the "!" in the R2 block). In some instances, the isolation device 305 that identifies the LOV fault is not the isolation device 305 closest to the fault. For example, the communication links between the isolation devices 305 and the FLISR unit 135 may have different latencies. For purposes of the following example, assume that the LOV fault is present due to a fault between the R4 isolation device 305 and the R6 isolation device 305 on the A phase, and the R2 isolation device 305 identifies the LOV fault responsive to the voltage dropping below the predefined threshold. FIG. 6A illustrates the power distribution network 105 prior to any automatic operations, with the fault illustrated on the A phase between the R4 and R6 isolation devices 305. The FLISR unit 135 identifies a first subset of the phases that includes the faulted phase, A, and a second subset of the phases that includes the non-faulted phases, B and C.

As shown in block 710, the FLISR unit 135 determines if the LOV fault is associated with an immediate lockout condition. In some embodiments, immediate lockout conditions include the LOV fault occurring at a transformer or at a substation, indicating an equipment failure. If an immediate lockout condition is identified (block 710), the FLISR unit 135 initiates a lockout of all phases of the isolation devices 305 closest to the LOV fault as shown in block 715.

As shown in block 720, the FLISR unit 135 determines if the LOV fault is associated with a concurrent underfrequency event. If a concurrent underfrequency event is identified, the FLISR unit 135 ignores the LOV event as shown in block 725.

In some embodiments, the FLISR unit 135 waits for a predetermined time interval (for example, 30 seconds) after receiving the lockout fault indication before proceeding with restoration operations. As shown in block 730, the FLISR unit 135 determines if the LOV fault is still present after the predetermined time interval. The FLISR unit 135 may evaluate the currently reported fault states or send a refresh command to the isolation devices 305 to evaluate the status of the LOV fault upon expiration of the timer (block 730). If the LOV fault clears (block 730), the FLISR unit 135 ignores the LOV fault as shown in block 725. If the LOV fault is still present (block 730), the FLISR unit 135 attempts to identify the fault location by examining the fault states of other isolation devices 305 starting from the source S3 and working toward the LOV fault issuing R2 isolation device 305.

As shown in block 740, the FLISR unit 135 identifies a downstream isolation device 305 representing the isolation device 305 immediately downstream of the LOV fault. The FLISR unit 135 starts at the source S3, and evaluates the fault states of the R11, R10, R8, R7, R6, and R4 isolation devices 305. Isolation devices 305 with asserted faults states are identified with "!" indicators, and isolation devices 305 with clear fault states are identified with "-" indicators in FIG. 6B. In the example of FIG. 6B, the R6 isolation device 305 is the last isolation device 305 with a clear fault state, and the R4 isolation device 305 is the downstream isolation device 305, as it is the first with an asserted LOV fault state. In general, the isolation devices 305 downstream of the fault, for example, the R4, R2, and R3 isolation devices 305, should have the same asserted LOV fault states, and the R6 isolation device 305 immediately upstream of the fault should have a LOV fault state that is clear since the fault does not affect the transmission lines associated with the R6 isolation device 305. The FLISR unit 135 identifies the isolation device 305 downstream of the R6 isolation device 305 with an asserted LOV fault state as the downstream isolation device 305 (in this example, the R4 isolation device 305) (block 740).

As shown in block 745, the FLISR unit 135 identifies a fault mismatch. A fault mismatch is registered in response to the R4 isolation device 305 having a fault state that registers a different LOV fault condition than the fault state of the R2 triggering isolation device 305. For example, a mismatch may be identified in an example where the R4 isolation device 305 registers an LOV affecting phase A, and the R2 triggering isolation devices 305 registers an LOV fault with a different phase. Although block 745 is illustrated as being performed after block 740, the mismatch condition is identified concurrently with the identification of the downstream isolation device 305 (block 740). In some embodiments, embodiments, if a fault mismatch is identified (block 745), the FLISR unit 135 opens all phases of the isolation device 305 with the fault mismatch as shown in block 750 and proceeds with three phase restoration. If a fault mismatch is not identified (block 745), the FLISR unit proceeds with single phase restoration operations. Alternatively, in some embodiments, the fault state of the triggering isolation device 305 controls the fault handling, even if one of the isolation devices 305 downstream of the triggering isolation device 305 has a fault mismatch.

As shown in block 755, the FLISR unit 135 sends open commands for the phases in the first subset affected by the LOV fault (in this example, the A phase) to the R4 downstream isolation device 305, as illustrated in FIG. 6C. Open transmission lines 200 are illustrated with dashed lines, where an open diamond is adjacent the isolation device 305 isolating the transmission line 200 from a power source.

As shown in block 760, the FLISR unit 135 sends close commands for a tie-in isolation device 305, as illustrated in FIG. 6D. For example, the R9 isolation device 305 is downstream of the fault and the R4 downstream isolation device 305 and can provide an alternate path for power from the source S3. In some embodiments, the FLISR unit 135 sends a ganged close command to the R9 tie-in isolation device 305. In some embodiments, the FLISR unit 135 sends mode messages to the R10, R8, R6, R7, R11, R9, R3, R2, and R4 isolation devices 305 on the paralleled phase placing them in one shot mode prior to sending the close commands. Thus, if one of the isolation devices 305 on the paralleled phases trips, automatic reclosing is prevented.

As shown in block 765, the FLISR unit 135 sends open commands to the R4 downstream isolation device 305 for the non-faulted phases, as illustrated in FIG. 6E. For example, the non-faulted phases in the second subset (in this example, the B and C phases) for the R4 isolation device 305 are fed by the source S3 from both sides. Opening the non-faulted phase(s) removes this looped source condition. In some embodiments, when there are multiple non-faulted phases, the FLISR unit 135 opens the non-faulted phases on the R4 downstream isolation device 305 individually using sequential open commands. In some embodiments, after completing the tie-in processing (block 765) without any trips, the FLISR unit 135 sends mode messages to the R7, R6, R4, R3, R2, R8, R10, and R11 isolation devices 305 placing them back in reclose mode.

Figure 8A:
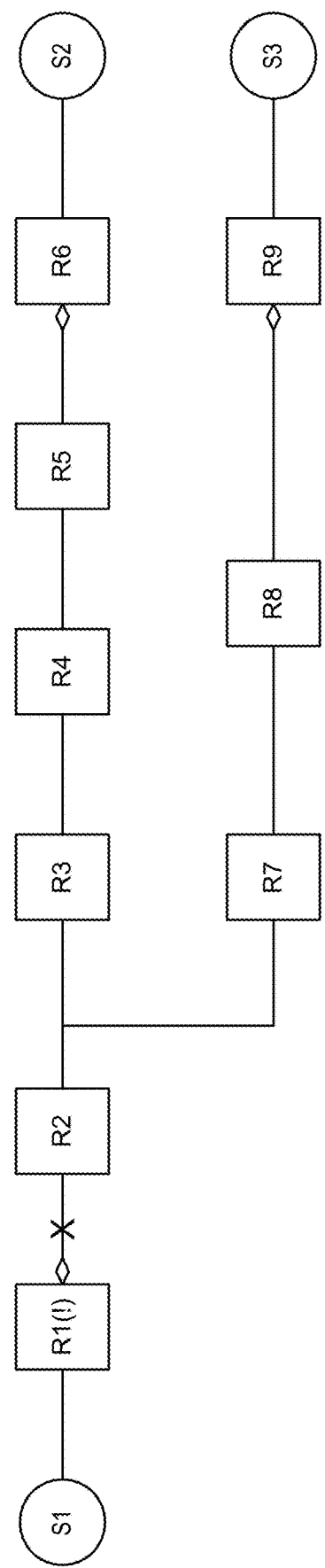
FIGS. 8A-8D are diagrams illustrating the operation of the system of FIG. 1 to perform a fault restoration operation using load estimation, according to some embodiments.
Figure 8B:
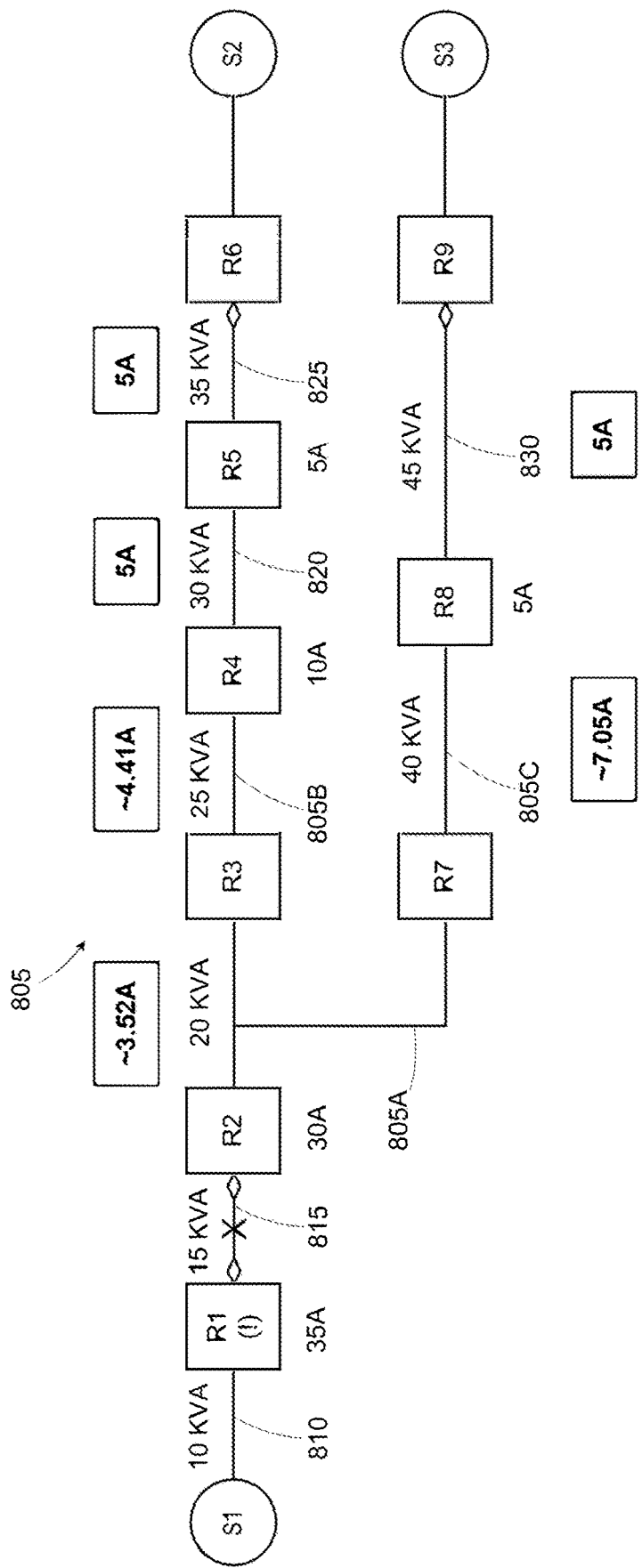
Figure 8C:
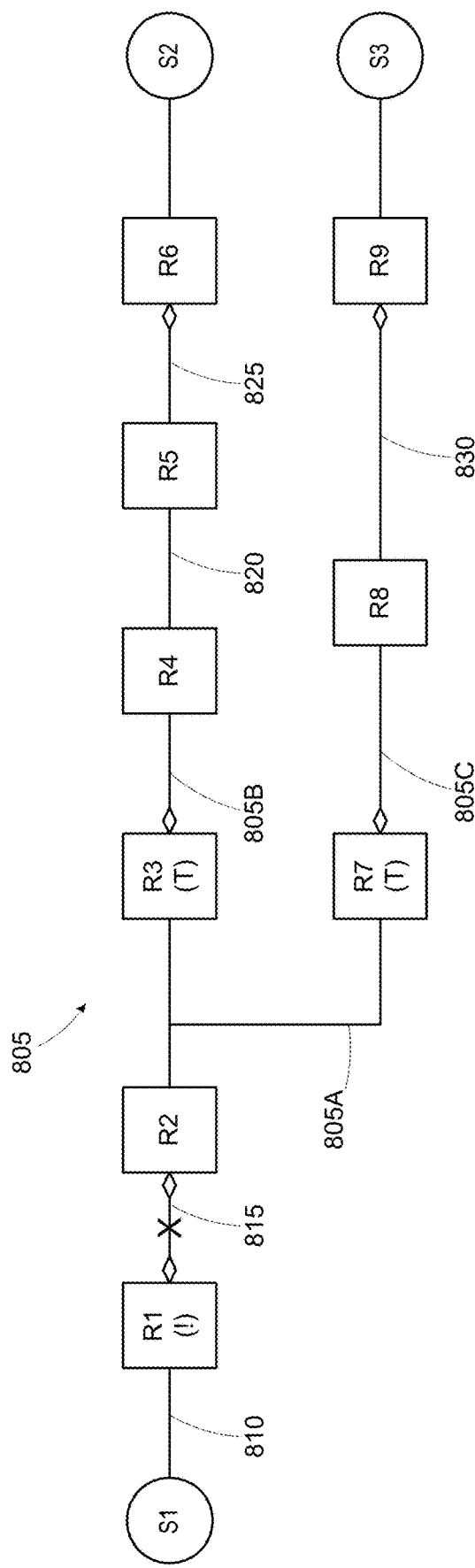
Figure 8D:
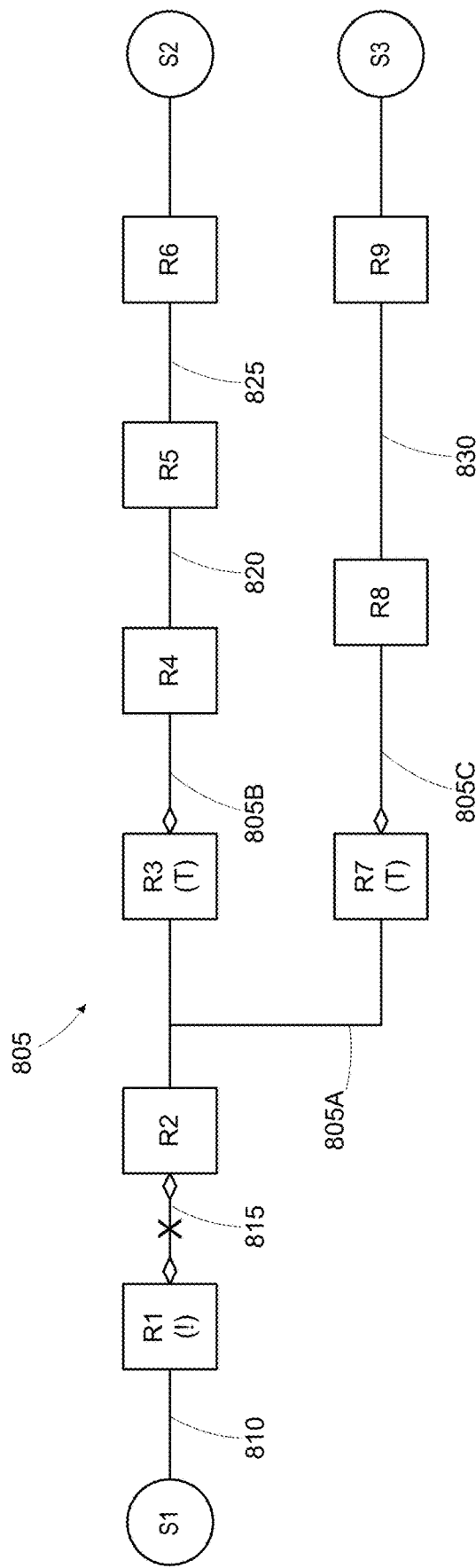
Figure 9:
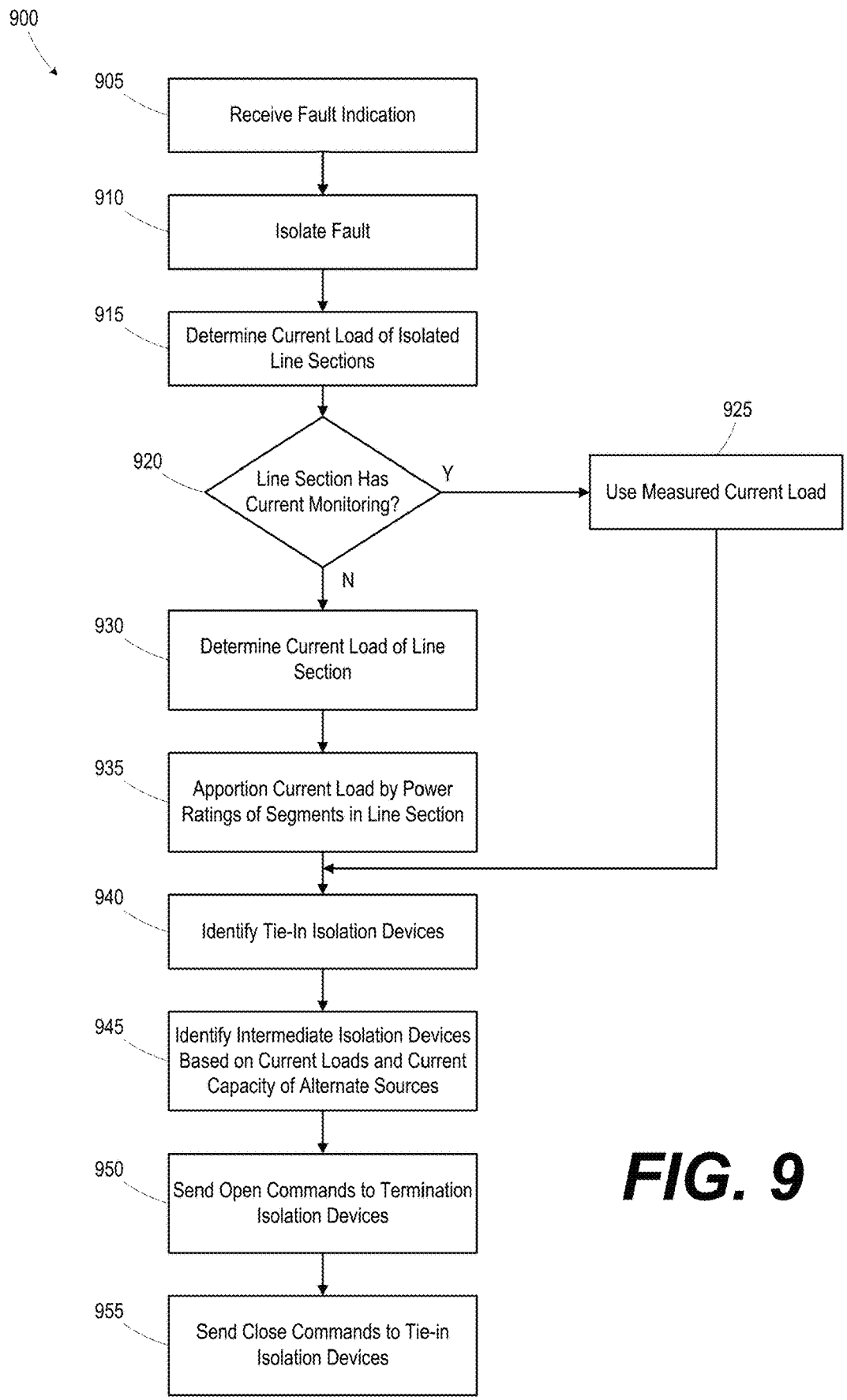
FIG. 9 is a flowchart of a method for operating the system of FIG. 1 to perform a fault restoration operation that uses load estimation, according to some embodiments.

Referring to FIGS. 8A-8D and FIG. 9, the operation of the system of FIG. 1 is illustrated for performing a fault restoration operation that uses load estimation. FIGS. 8A-8D are diagrams illustrating the operation of the system of FIG. 1 for performing a fault restoration operation using load estimation, according to some embodiments. FIG. 9 is a flowchart of a method 900 for operating the system of FIG. 1 for performing a fault restoration operation that uses load estimation, according to some embodiments. The processing of FIGS. 8A-8D and FIG. 9 may be combined with the methods described above in FIGS. 5 and 7. FIGS. 8A-8D illustrate a single phase, however, as described above, multiples phases may be associated with a fault, and processing shown in the following example may be applied to each of the faulted phases.

As shown in block 905, a fault indication is received. In some embodiments, the fault indication is a lockout fault (for example, current fault, phase to phase fault, ground fault, etc.) In some embodiments, the fault indication is an LOV fault. For purposes of discussion, as illustrated in FIG. 8A, the fault received in block 905 is a lockout fault present between the R1 and R2 isolation devices 305, as shown by the "X" in FIG. 8A. As described above, any of the isolation devices 305 upstream of the fault may register the lockout event. In this example, the R1 isolation device 305 registers the fault, as indicated by the "!" in the R1 block. If one of the other isolation devices 305 registered the fault, the FLISR unit 135 evaluates the fault states to identify the upstream isolation device 305 closest to the fault, as described above in reference to FIG. 5.

As shown in block 910 and FIG. 8B, the FLISR unit 135 isolates the fault. In some embodiments, the FLISR unit 135 isolates the fault by opening the subset of the phases associated with the fault on the downstream isolation device 305, which in the example of FIGS. 8A-8D, is the R2 isolation device 305. In some embodiments, where the fault is a lockout fault, the isolation device 305 that initiates the fault detection and initially opens is not the isolation device 305 closest to the fault. In such a scenario, the FLISR unit 135 also identifies and opens subset of the phases associated with the fault for the upstream isolation device as described above in reference to FIG. 5.

As shown in block 915, the FLISR unit 135 determines the current load of the isolated line sections. The isolated line sections are those for which power is interrupted by the opening of the R2 downstream isolation device 305.

As shown in block 920, the FLISR unit differentiates between line sections having current monitoring and line sections not having current monitoring. A line section may include multiple segments. In the example of FIGS. 8A-8D, the R1, R2, R4, R5, and R8 isolation devices 305 include current monitoring hardware, and the R3 and R7 isolation devices 305 do not include current monitoring hardware or the current monitoring hardware is not operating properly. A line section 805 without current monitoring is defined by multiple line segments, such as the line segments 805A, 805B, 805C, positioned between isolation devices 305 with current monitoring. Line sections 810, 815, 820, 825, 830 between isolation devices 305 with current monitoring are designated as line sections with current monitoring.

As shown in block 925, for line sections with current monitoring, the FLISR unit 135 uses the measured current to determine the current load. In the example of FIGS. 8A-8D the current measured prior to the identification of the fault is indicted below the isolation device 305 if current monitoring hardware is present. For example, prior to the fault, the R1 isolation device 305 measured 35 A, the R2 isolation device 305 measured 30 A, the R4 isolation device 305 measured 10 A, the R5 isolation device 305 measured 5 A, and the R8 isolation device 305 measured 5 A. The current load of a line section is seen as the amount of current distributed to customers on that line segment. The current load is the difference between the incoming current measurement and the exiting current measurement. For example, the current load in the line section 820 is 5 A, the current load in the line segment 825 is 5 A, and the current load in the line segment 830 is 5 A.

As shown in block 930, for line sections without current monitoring, the FLISR unit 135 determines the current load of the line section. Since the line section 805 without current monitoring is bounded by the R2, R4, and R8 isolation devices 305 with current monitoring, the current entering the line section 805 and the current exiting the line section 805 are known. The FLISR unit 135 determines the current load of the line section 805 by subtracting the exiting current measurement from the entering current measurement. In the example of FIG. 8B, the total current load of the line section 805 is the entering current measurement received from the R2 isolation device 305 of 30 A less the exiting current measurements received from the R4 isolation device 305 of 10 A and the R8 isolation device 305 of 5: total current load=30 A−10 A−5 A=15 A.

As shown in block 935, the FLISR unit 135 apportions the total current load based on load ratings of the segments in the line section without current monitoring. In the example of FIG. 8B the load ratings of the line segments 805A, 805B, 805C, and the line sections 810-830 are shown above the segment or section in KVA. To apportion the total current load, the FLISR unit multiples the total current load by the ratio of the load rating of the selected line segment to the total load rating of all the line segments in the line section without current monitoring. In the present example of FIG. 8B:

$$I_{A=}I_{LOAD} * \frac{PR_A}{PR_A + PR_B + PR_C} = 15 * \frac{20}{20 + 25 + 40} = \sim 3.52A$$

$$I_{B=}I_{LOAD} * \frac{PR_B}{PR_A + PR_B + PR_C} = 15 * \frac{25}{20 + 25 + 40} = \sim 4.41A$$

$$I_{C=}I_{LOAD} * \frac{PR_C}{PR_A + PR_B + PR_C} = 15 * \frac{40}{20 + 25 + 40} = \sim 7.05A$$

As shown in block 940, the FLISR unit 135 identifies one or more tie-in isolation devices 305 that can be closed to restore power to lines downstream of the fault. In the example of FIGS. 8A-8D, the tie-in isolation devices 305 are the R6 and R9 isolation devices 305.

As shown in block 945, the FLISR unit 135 identifies or selects intermediate isolation devices 305 that bound the line sections that can be restored using the free current associated with an alternate source feeding the tie-in isolation device 305. In the examples described above in references to FIGS. 5 and 7, it was assumed that the source associated with the tie-in isolation device 305 had sufficient capacity to restore service to all the line sections downstream of the fault. However, in the example of FIGS. 8A-8D, assume the source S2 has a free capacity of 15 A and the source S3 has a free capacity of 13 A. Thus, the free current is not sufficient to restore power to all the line sections 805-830. The FLISR unit 135 uses the free capacity of the alternate sources and the determined current load to identify which line sections 805-830 can be restored. Starting from the alternate source S2 and the R5 tie-in isolation device 305, the FLISR unit 135 determines that the free capacity of 15 A for the source S2 is sufficient to supply the 10 A for the line sections 820, 825 and the ~4.41 A for the line segment 805B of the line section 805. The R3 isolation device 305 is designated as an intermediate isolation device (as designated by a "T" in FIG. 8C). Starting from the alternate source S3 and the R9 tie-in isolation device 305, the FLISR unit 135 determines that the free capacity of 13 A for the source S3 is sufficient to supply the 5 A for the line section 830 and the ~7.05 A for the line segment 805C of the line section 805. The R7 isolation device 305 is designated as an intermediate tie-in device (as designated by a "T" in FIG. 8C).

As shown in block 950, the FLISR unit 135 sends opens commands to the identified R3 and R7 intermediate isolation devices 305 for the phase or phases that will cause the alternate source to be overloaded if the R6 and R9 tie-in isolation devices 305 were to be closed, as illustrated in FIG. 8C. As shown in block 955, the FLISR unit 135 sends close commands to the identified R6 and R9 tie-in isolation devices 305, as illustrated in FIG. 8D. Sending the open commands prior to the close commands avoids overloading the lines if the current load is too high. In some embodiments, the close commands sent to the tie-in isolation devices 305 are ganged close commands, resulting in parallel sources on the non-faulted phases. In some embodiments, the FLISR unit 135 sends open commands for the non-faulted phases to the R2 isolation device 305 to remove the parallel condition.

Among other things, the techniques described herein isolate faults and restore power using an individual phase approach. This approach increases system utilization by reducing the number of customers experiencing power outages as a result from a fault condition, thereby increasing customer satisfaction and preserving revenue generated by the non-affected phases. Using measured current load for line sections with current monitoring and estimating current load for line sections without current monitoring increases the accuracy of the load estimation, providing more effective service restoration.

The following examples illustrate example systems and methods described herein.

Example 1: a system for controlling a power distribution network, the system comprising: an electronic processor configured to: receive a fault indication associated with a fault in the power distribution network from a first isolation device of a plurality of isolation devices; send a first open command to a downstream isolation device downstream of the fault; identify a tie-in isolation device; identify a first line section without current monitoring positioned between the tie-in isolation device and the downstream isolation device, wherein the first line section has a plurality of line segments, and each line segment has a load rating; receive an incoming current measurement and an exiting current measurement for the first line section; estimate a first current load for each of the line segments in the first line section based on the incoming current measurement, the exiting current measurement, and the load ratings of the line segments; select an intermediate isolation device between the tie-in isolation device and the downstream isolation device based on the first current loads; send a second open command to the intermediate isolation device; and send a close command to the tie-in isolation device.

Example 2: the system of example 1, wherein the electronic processor is configured to: identify a second line section with current monitoring positioned between the first line section and the tie-in isolation device; and receive the exiting current measurement from a second isolation device of the plurality of isolation devices associated with the second line section.

Example 3: the system of examples 1-2, wherein the electronic processor is configured to: subtract the exiting current measurement from the incoming current measurement to determine a total current load for the first line section; and apportion the total current load to the line segments based on the load ratings of the line segments to estimate the first current load for each of the line segments.

Example 4: the system of examples 1-3, wherein the electronic processor is configured to apportion the total current load for each of the line segments by: summing the load ratings of the line segments to generate a total load rating; and multiplying the total current load by a ratio of the load rating for a selected line segment to the total load rating.

Example 5: the system of examples 1-4, wherein the power distribution network provides power using a plurality of phases, and the electronic processor is configured to: identify a first subset of the plurality of phases associated with the fault indication and a second subset of the plurality of phases not associated with the fault indication, wherein the first subset and the second subset each include at least one member; send the first open command to the downstream isolation device for each phase in the first subset; send the second open command to the intermediate isolation device for each phase in the first subset; send the close command to the tie-in isolation device for each of the plurality of phases; and send a third open command to the intermediate isolation device for each phase in the second subset.

Example 6: the system of examples 1-5, wherein the electronic processor is configured to: identify an upstream isolation device upstream of the fault; and responsive to the first isolation device not being the upstream isolation device, send a close command to the first isolation device for each phase in the first subset.

Example 7: the system of examples 1-6, wherein the electronic processor is configured to identify the upstream isolation device by: receiving fault states of the plurality of isolation devices; and designating a first selected isolation device positioned furthest downstream of a first source in the power distribution network having a fault state consistent with the first fault indication as the upstream isolation device.

Example 8: the system of examples 1-7, wherein the electronic processor is configured to: identify the downstream isolation device by designating a second selected isolation device positioned downstream of the upstream isolation device having a fault state that does not indicate the first fault indication as the downstream isolation device.

Example 9: the system of examples 1-8, wherein the electronic processor is configured to send the close command to the tie-in isolation device by sending a ganged close command to concurrently close all the phases of the tie-in isolation device.

Example 10: the system of examples 1-9, wherein the fault comprises at least one selected from the group comprising a lockout fault that results in the first isolation device opening the first subset of the plurality of phases and a loss of voltage fault.

Example 11: a method for controlling a power distribution network, comprising: receiving, by an electronic processor, a fault indication associated with a fault in the power distribution network from a first isolation device of a plurality of isolation devices; sending, by the electronic processor, a first open command to a downstream isolation device downstream of the fault; identifying, by the electronic processor, a tie-in isolation device; identifying, by the electronic processor, a first line section without current monitoring positioned between the tie-in isolation device and the downstream isolation device, wherein the first line section has a plurality of line segments, and each line segment has a load rating; receiving, by the electronic processor, an incoming current measurement and an exiting current measurement for the first line section; estimating, by the electronic processor, a first current load for each of the line segments in the first line section based on the incoming current measurement, the exiting current measurement, and the load ratings of the line segments; selecting, by the electronic processor, an intermediate isolation device between the tie-in isolation device and the downstream isolation device based on the first current loads; sending, by the electronic processor, a second open command to the intermediate isolation device; and sending, by the electronic processor, a close command to the tie-in isolation device.

Example 12: the method of example 11, comprising: receiving, by the electronic processor, the exiting current measurement from a second isolation device of the plurality of isolation devices associated with a second line section with current monitoring positioned between the first line section and the tie-in isolation device.

Example 13: the method of examples 11-12, comprising: subtracting, by the electronic processor, the exiting current measurement from the incoming current measurement to determine a total current load for the first line section; and apportioning, by the electronic processor, the total current load to the line segments based on the load ratings of the line segments to estimate the first current load for each of the line segments.

Example 14: the method of examples 11-13, wherein apportioning the total current load comprises: summing, by the electronic processor, the load ratings of the line segments to generate a total load rating; and multiplying, by the electronic processor, the total current load by a ratio of the load rating for a selected line segment to the total load rating.

Example 15: the method of examples 11-14, wherein the power distribution network provides power using a plurality of phases, and the method further comprises: identifying, by the electronic processor, a first subset of the plurality of phases associated with the fault indication and a second subset of the plurality of phases not associated with the fault indication, wherein the first subset and the second subset each include at least one member; sending, by the electronic processor, the first open command to the downstream isolation device for each phase in the first subset; sending, by the electronic processor, the second open command to the intermediate isolation device for each phase in the first subset; sending, by the electronic processor, the close command to the tie-in isolation device for each of the plurality of phases; and sending, by the electronic processor, a third open command to the intermediate isolation device for each phase in the second subset.

Example 16: the method of examples 11-15, further comprising: identifying, by the electronic processor, an upstream isolation device upstream of the fault; and responsive to the first isolation device not being the upstream isolation device, sending, by the electronic processor, a close command to the first isolation device for each phase in the first subset.

Example 17: the method of examples 11-16, wherein identifying the upstream isolation device further comprises: receiving, by the electronic processor, fault states of the plurality of isolation devices; and designating, by the electronic processor, a first selected isolation device positioned furthest downstream of a first source in the power distribution network having a fault state consistent with the first fault indication as the upstream isolation device.

Example 18: the method of examples 11-17, further comprising: identifying, by the electronic processor, the downstream isolation device by designating a second selected isolation device positioned downstream of the upstream isolation device having a fault state that does not indicate the first fault indication as the downstream isolation device.

Example 19: the method of examples 11-18, wherein sending the close command to the tie-in isolation device comprises: sending, by the electronic processor, a ganged close command to concurrently close all the phases of the tie-in isolation device.

Example 20: the method of examples 11-19, wherein the fault comprises at least one selected from the group comprising a lockout fault that results in the first isolation device opening the first subset of the plurality of phases and a loss of voltage fault.

Various features and advantages of the embodiments described herein are set forth in the following claims.

What is claimed is:

1. A system for controlling a power distribution network, the system comprising:
an electronic processor configured to:
receive a fault indication associated with a fault in the power distribution network from a first isolation device of a plurality of isolation devices, the fault being associated with a phase of a plurality of phases of the power distribution network;
send a first open command to a downstream isolation device downstream of the fault;
identify a tie-in isolation device;
identify a first line section without current monitoring positioned between the tie-in isolation device and the downstream isolation device, wherein the first line section has a plurality of line segments, and each line segment has a load rating;
receive an incoming current measurement and an exiting current measurement for the first line section;
estimate a first current load for each of the line segments in the first line section based on the incoming current measurement, the exiting current measurement, and the load ratings of the line segments;
select an intermediate isolation device between the tie-in isolation device and the downstream isolation device based on the first current loads;
send a second open command to the intermediate isolation device; and
send a close command to the tie-in isolation device
wherein each of the open command, second open command, and the close command correspond to the phase of the plurality of phases of the power distribution network.

2. The system of claim 1, wherein the electronic processor is configured to:
identify a second line section with current monitoring positioned between the first line section and the tie-in isolation device; and
receive the exiting current measurement from a second isolation device of the plurality of isolation devices associated with the second line section.

3. The system of claim 1, wherein the electronic processor is configured to:
subtract the exiting current measurement from the incoming current measurement to determine a total current load for the first line section; and
apportion the total current load to the line segments based on the load ratings of the line segments to estimate the first current load for each of the line segments.

4. The system of claim 3, wherein the electronic processor is configured to apportion the total current load for each of the line segments by:
summing the load ratings of the line segments to generate a total load rating; and
multiplying the total current load by a ratio of the load rating for a selected line segment to the total load rating.

5. The system of claim 1, wherein the power distribution network provides power using the plurality of phases, and the electronic processor is configured to:
identify a first subset of the plurality of phases associated with the fault indication and a second subset of the plurality of phases not associated with the fault indication, wherein the first subset and the second subset each include at least one member;
send the first open command to the downstream isolation device for each phase in the first subset;
send the second open command to the intermediate isolation device for each phase in the first subset;
send the close command to the tie-in isolation device for each of the plurality of phases; and
send a third open command to the intermediate isolation device for each phase in the second subset.

6. The system of claim 5, wherein the electronic processor is configured to:
identify an upstream isolation device upstream of the fault; and
responsive to the first isolation device not being the upstream isolation device, send a close command to the first isolation device for each phase in the first subset.

7. The system of claim 6, wherein the electronic processor is configured to identify the upstream isolation device by:

receiving fault states of the plurality of isolation devices; and designating a first selected isolation device positioned furthest downstream of a first source in the power distribution network having a fault state consistent with the first fault indication as the upstream isolation device.

8. The system of claim 7, wherein the electronic processor is configured to:

identify the downstream isolation device by designating a second selected isolation device positioned downstream of the upstream isolation device having a fault state that does not indicate the first fault indication as the downstream isolation device.

9. The system of claim 5, wherein the electronic processor is configured to send the close command to the tie-in isolation device by sending a ganged close command to concurrently close all the phases of the tie-in isolation device.

10. The system of claim 5, wherein the fault comprises at least one selected from the group comprising a lockout fault that results in the first isolation device opening the first subset of the plurality of phases and a loss of voltage fault.

11. A method for controlling a power distribution network, comprising:

receiving, by an electronic processor, a fault indication associated with a fault in the power distribution network from a first isolation device of a plurality of isolation devices, the fault being associated with a phase of a plurality of phases of the power distribution network;

sending, by the electronic processor, a first open command to a downstream isolation device downstream of the fault;

identifying, by the electronic processor, a tie-in isolation device;

identifying, by the electronic processor, a first line section without current monitoring positioned between the tie-in isolation device and the downstream isolation device, wherein the first line section has a plurality of line segments, and each line segment has a load rating;

receiving, by the electronic processor, an incoming current measurement and an exiting current measurement for the first line section;

estimating, by the electronic processor, a first current load for each of the line segments in the first line section based on the incoming current measurement, the exiting current measurement, and the load ratings of the line segments;

selecting, by the electronic processor, an intermediate isolation device between the tie-in isolation device and the downstream isolation device based on the first current loads;

sending, by the electronic processor, a second open command to the intermediate isolation device; and sending, by the electronic processor, a close command to the tie-in isolation device, wherein each of the open command, second open command, and the close command correspond to the phase of a plurality of phases of the power distribution network.

12. The method of claim 11, comprising:

receiving, by the electronic processor, the exiting current measurement from a second isolation device of the plurality of isolation devices associated with a second line section with current monitoring positioned between the first line section and the tie-in isolation device.

13. The method of claim 11, comprising:

subtracting, by the electronic processor, the exiting current measurement from the incoming current measurement to determine a total current load for the first line section; and apportioning, by the electronic processor, the total current load to the line segments based on the load ratings of the line segments to estimate the first current load for each of the line segments.

14. The method of claim 13, wherein apportioning the total current load comprises:

summing, by the electronic processor, the load ratings of the line segments to generate a total load rating; and multiplying, by the electronic processor, the total current load by a ratio of the load rating for a selected line segment to the total load rating.

15. The method of claim 11, wherein the power distribution network provides power using the plurality of phases, and the method further comprises:

identifying, by the electronic processor, a first subset of the plurality of phases associated with the fault indication and a second subset of the plurality of phases not associated with the fault indication, wherein the first subset and the second subset each include at least one member;

sending, by the electronic processor, the first open command to the downstream isolation device for each phase in the first subset;

sending, by the electronic processor, the second open command to the intermediate isolation device for each phase in the first subset;

sending, by the electronic processor, the close command to the tie-in isolation device for each of the plurality of phases; and sending, by the electronic processor, a third open command to the intermediate isolation device for each phase in the second subset.

16. The method of claim 15, further comprising:

identifying, by the electronic processor, an upstream isolation device upstream of the fault; and responsive to the first isolation device not being the upstream isolation device, sending, by the electronic processor, a close command to the first isolation device for each phase in the first subset.

17. The method of claim 16, wherein identifying the upstream isolation device further comprises:

receiving, by the electronic processor, fault states of the plurality of isolation devices; and designating, by the electronic processor, a first selected isolation device positioned furthest downstream of a first source in the power distribution network having a fault state consistent with the first fault indication as the upstream isolation device.

18. The method of claim 17, further comprising:

identifying, by the electronic processor, the downstream isolation device by designating a second selected isolation device positioned downstream of the upstream isolation device having a fault state that does not indicate the first fault indication as the downstream isolation device.

19. The method of claim 15, wherein sending the close command to the tie-in isolation device comprises:

sending, by the electronic processor, a ganged close command to concurrently close all the phases of the tie-in isolation device.

20. The method of claim 15, wherein the fault comprises at least one selected from the group comprising a lockout fault that results in the first isolation device opening the first subset of the plurality of phases and a loss of voltage fault.

* * * * *